United States Patent
Matsubara

(10) Patent No.: US 10,373,921 B2
(45) Date of Patent: Aug. 6, 2019

(54) POWER GATE CIRCUITS FOR SEMICONDUCTOR DEVICES

(71) Applicant: MICRON TECHNOLOGY, INC., Boise, ID (US)

(72) Inventor: Yasushi Matsubara, Isehara (JP)

(73) Assignee: Micron Technology, Inc., Boise, ID (US)

( * ) Notice: Subject to any disclaimer, the term of this patent is extended or adjusted under 35 U.S.C. 154(b) by 87 days.

(21) Appl. No.: 15/628,343

(22) Filed: Jun. 20, 2017

(65) Prior Publication Data

US 2018/0366422 A1    Dec. 20, 2018

(51) Int. Cl.
| | |
|---|---|
| *H01L 23/02* | (2006.01) |
| *H01L 23/64* | (2006.01) |
| *H01L 23/00* | (2006.01) |
| *H01L 25/07* | (2006.01) |
| *H01L 25/18* | (2006.01) |
| *H02M 7/00* | (2006.01) |
| *G11C 5/14* | (2006.01) |
| *G11C 11/4074* | (2006.01) |
| *G11C 11/4072* | (2006.01) |
| *G11C 11/408* | (2006.01) |

(52) U.S. Cl.
CPC .......... *H01L 23/645* (2013.01); *G11C 5/14* (2013.01); *H01L 24/48* (2013.01); *H01L 25/072* (2013.01); *H01L 25/18* (2013.01); *H02M 7/003* (2013.01); *G11C 11/408* (2013.01); *G11C 11/4072* (2013.01); *G11C 11/4074* (2013.01); *H01L 2224/49109* (2013.01); *H01L 2924/1306* (2013.01)

(58) Field of Classification Search
CPC ..... H01L 2224/16145; H01L 29/66666; H01L 29/7827; H01L 29/7788; H01L 29/66272; H01L 29/78645; H01L 29/732
USPC .......................... 257/302, 686, 777, 723, 724
See application file for complete search history.

(56) References Cited

U.S. PATENT DOCUMENTS

| | | | |
|---|---|---|---|
| 8,742,490 B2* | 6/2014 | Disney | H01L 23/49562 257/328 |
| 8,912,052 B2* | 12/2014 | Or-Bach | H03K 17/687 257/E21.606 |
| 9,500,678 B2* | 11/2016 | Williams | H01L 23/49575 |
| 2007/0228434 A1* | 10/2007 | Shimojo | G11C 5/02 257/296 |

(Continued)

OTHER PUBLICATIONS

Kim, K. K. et al., "Adaptive HCI-aware Power Gating Structure", IEEE; 11th Int'l Symposium on Quality Electronic Design; Mar. 22-24, 2010.

(Continued)

*Primary Examiner* — S. V. Clark
(74) *Attorney, Agent, or Firm* — Dorsey & Whitney LLP

(57) ABSTRACT

Apparatuses and methods for gate power to circuits of semiconductor devices are described. An example apparatus includes a substrate, a first wiring and a second wiring, and a plurality of transistors. The first wiring may be supplied with a power voltage, and the first wiring is formed over the substrate and is elongating in a first direction. The second wiring may be formed between the substrate and the first wiring, and vertically overlapping the first wiring with the second wiring elongating in the first direction. The plurality of transistors are vertically coupled between the first wiring and the second wiring.

17 Claims, 14 Drawing Sheets

(56) References Cited

U.S. PATENT DOCUMENTS

| | | | |
|---|---|---|---|
| 2007/0263433 A1* | 11/2007 | Osada | H01L 27/24 |
| | | | 365/163 |
| 2010/0194470 A1* | 8/2010 | Monchiero | H01L 25/0657 |
| | | | 327/566 |
| 2014/0217611 A1* | 8/2014 | Mizukami | H01L 23/5226 |
| | | | 257/774 |
| 2015/0256175 A1* | 9/2015 | Ota | H03K 19/0005 |
| | | | 327/306 |

OTHER PUBLICATIONS

Kim, K. K. et al., "Hybrid MOSFET/CNFET Based Power Gating Structure", IEEE International SOC Conference, Sep. 27-29, 2010.

* cited by examiner

| Mode register | CKE | RasActive | DeepStandby | Power Gate Circuit 322 | Power Gate Circuits 324 & 326 |
|---|---|---|---|---|---|
| H | H | Active | Enable | ON | ON |
| H | H | Inactive | Enable | ON | OFF |
| H | L | Active | Disable | ON | OFF |
| H | L | Inactive | Enable | OFF | OFF |
| L | H | Active | Disable | ON | ON |
| L | H | Inactive | Disable | ON | OFF |
| L | L | Active | Disable | ON | OFF |
| L | L | Inactive | Disable | ON | OFF |

POWER GATE CIRCUITS FOR SEMICONDUCTOR DEVICES

BACKGROUND

Semiconductor devices include integrated circuits and are used in many electronic products. The circuits are integrated together on a semiconductor die. Many of these electronic products are battery operated and/or operate in environments with limited power. As such, these electronic products have semiconductor devices that include integrated circuits which are designed to have relatively low power consumption. Various approaches are taken to reduce power consumption to satisfy the desire for relatively low power consumption. For example, integrated circuits are designed with reduced dimensions and operate with lower voltage requirements, into circuits unnecessary for a current operation may be shut down or placed in an idle mode, internal clock frequencies may be reduced where possible, as well as other approaches.

Another approach for reducing power consumption is to control provision of power to various circuits or groups of circuits such that power is provided to the circuits when operated, but power is not provided to the circuits (e.g., disconnected) when not operated. Power gate circuits may be included and used for controlling the provision of power to the various circuits or groups of circuits in this manner. The power gate circuits include circuits that are capable of carrying sufficient power to the various circuits or groups of circuits when activated. Such circuits in the power gate circuits are often large and require significant area, on the semiconductor die. However, with increasing demands for smaller electronic products and/or higher density integrated circuits, there is a desire to reduce the size of circuits integrated onto a semiconductor die.

BRIEF DESCRIPTION OF THE DRAWINGS

FIG. 4 is a diagram showing control of the power circuits of FIG. 3 according to an embodiment of the disclosure.

DETAILED DESCRIPTION

Certain details are set forth below to provide a sufficient understanding of examples of the disclosure. However, it will be clear to one having skill in the art that examples of the disclosure may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically coupled. Indirectly coupled may imply that two components are coupled through one or more intermediate components.

Figure 1:
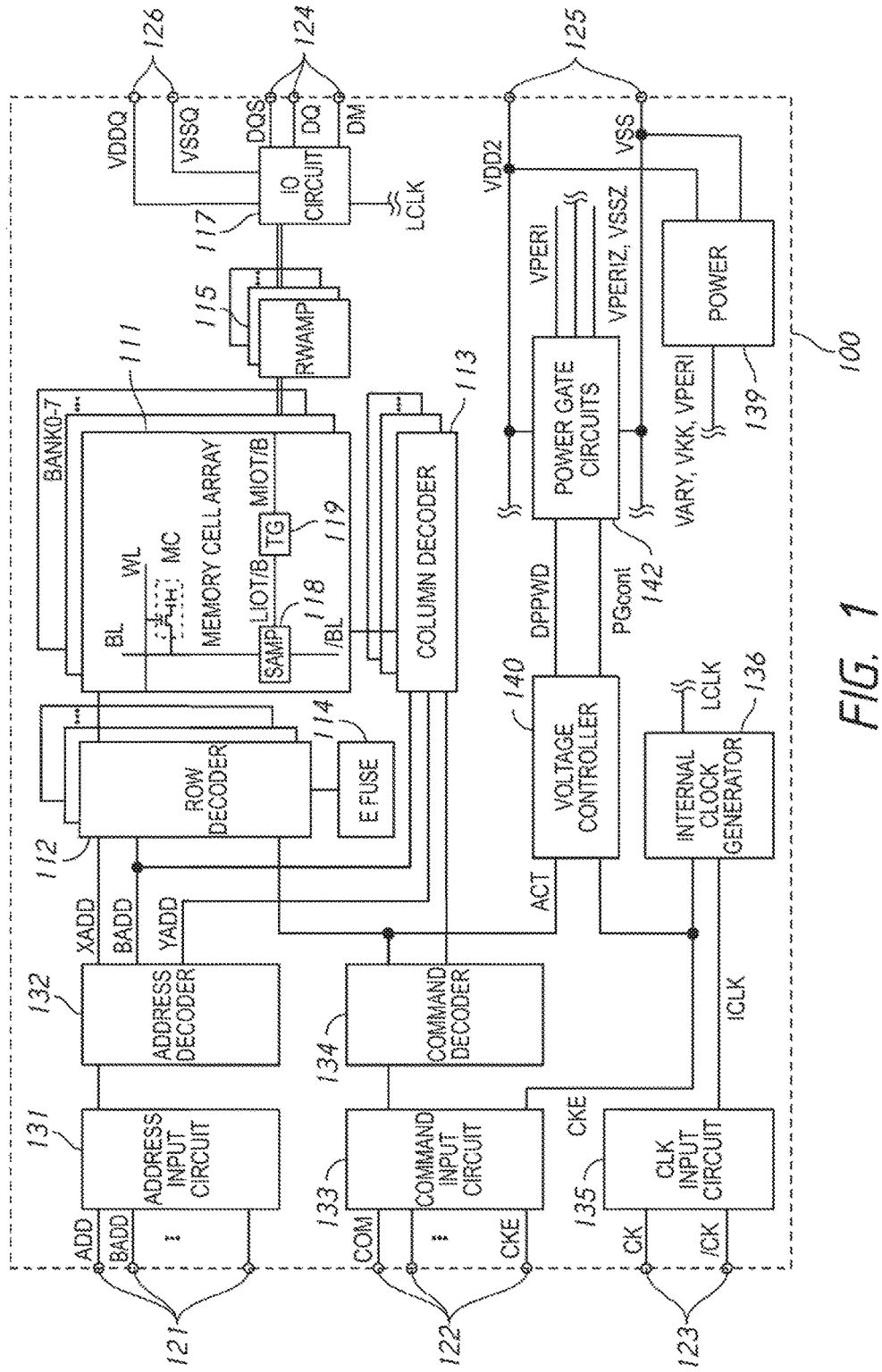
FIG. 1 is a block diagram of a semiconductor device according to an embodiment of the disclosure.

FIG. 1 is a block diagram of a semiconductor device 100 according to an embodiment of the disclosure. The semiconductor device 100 may be a DDR4 SDRAM integrated into a single semiconductor chip, for example. The semiconductor device 100 includes a memory cell array 111. The memory cell array 111 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 112 and the selection of the bit line BL is performed by a column decoder 113. Sense amplifiers 118 are coupled to corresponding bit lines BL and connected to local I/O line pairs LIOT/B. Local IO line pairs LIOT/B are connected to main IO line pairs MIOT/B via transfer gates TG 119 which function as switches. A fuse circuit 114 includes programmable non-volatile memory (e.g., fuses, antifuses, etc.) as well as programming and reading circuits that may be used to program the programmable memory to store information, for example, repair information for defective memory locations. The information may be used by the row decoder 112 and the column decoder 113 to identify the defective memory locations and map the corresponding memory addresses to redundant memory included in the memory cell array 111.

Turning to the explanation of a plurality of external terminals included in the semiconductor device 100, the plurality of external terminals includes address terminals 121, command terminals 122, clock terminals 123, data terminals 124, and power supply terminals 125 and 126. The data terminals 124 may be coupled to output buffers for read operations of memories. Alternatively, the data terminals 124 may be coupled to input buffers for read/write access of the memories.

The address terminals 121 are supplied with an address signal ADD and a bank address signal BADD. The address signal ADD and the bank address signal BADD supplied to the address terminals 121 are transferred via an address input circuit 131 to an address decoder 132. The address decoder 132 receives the address signal ADD and supplies a decoded row address signal XADD to the row decoder 112, and a decoded column address signal YADD to the column decoder 113. The address decoder 132 also receives the bank address signal BADD and supplies the bank address signal BADD to the row decoder 112, and the column decoder 113.

The command terminals 122 are supplied with a command signal COM and a clock enable signal CKE. The command signal COM may include one or more separate signals. The command signal COM input to the command terminals 121 is input to a command decoder 134 via the command input circuit 133. The command decoder 134 decodes the command signal COM to generate various internal command signals. For example, the internal commands may include a row command signal to select a word line and a column command signal, such as a read command or a write command, to select a bit line. The internal commands may further include a row activation signal ACT which is used to activate various circuits of the semiconductor device 100 for a memory access operation. For example, the ACT signal is provided to the row decoder 112 to activate row decoder circuits for a memory access operation, and further provided to a voltage controller 140.

When a read command is issued and a row address and a column address are timely supplied with the read command, read data is read from a memory cell MC in the memory cell array 111 designated by these row address and column address. The read data DQ is output externally from the data terminals 124 via a read/write amplifier 115 and an input/output circuit 117. Similarly, when the write command is issued and a row address and a column address are timely supplied with this command, and then write data DQ is supplied to the data terminals 124, the write data DQ is supplied via the input/output circuit 117 and the read/write amplifier 115 to the memory cell array 111 and written in the memory cell MC designated by the row address and the column address.

The clock terminals 123 are supplied with external clock signals CK and /CK, respectively. These external clock signals CK and /CK are complementary to each other and are supplied to a clock input circuit 135. The clock input circuit 135 receives the external clock signals CK and /CK and generates an internal clock signal ICLK. The internal clock signal ICLK is supplied to an internal clock generator 136 and thus a phase controlled internal clock signal LCLK is generated based on the received internal clock signal ICLK and the clock enable signal CKE from the command input circuit 133. Although not limited thereto, a DLL circuit can be used as the internal clock generator 136. The phase controlled internal clock signal LCLK is supplied to the input/output circuit 117 and is used as a timing signal for determining an output timing of the read data DQ.

The power supply terminals 125 are supplied with power supply potentials VDD2 and VSS. These power supply potentials VDD2 and VSS are supplied to an internal power supply circuit 139. The internal power supply circuit 139 generates various internal potentials VPP, VOD, VARY, VPERI, and the like based on the power supply potentials VDD2 and VSS. The internal potential VPP is mainly used in the row decoder 112, the internal potentials VOD and VARY are mainly used in the sense amplifiers 118 included in the memory cell array 111, and the internal potential VPERI is used in many other circuit blocks.

The power supply potentials VDD2 and VSS are also provided to power gate circuits 142. The power gate circuits 142 may be controlled by the voltage controller 140 to provide various internal potentials VPERI, VPERIZ, VSSZ, and the like. The voltage controller 140, which as previously mentioned receives the ACT signal from the command decoder 134, provides control signals PGCont and DPPWD to control the power gate circuits 142. The power gate circuits 142 may be controlled by the voltage controller 140 to provide the various internal potentials to circuits when, for example, a memory access operation is performed. When the circuits that receive power from the power gate circuit are not operating, for example, during a standby mode or a power savings mode, the power gate circuits 142 may be controlled to stop providing power to those circuit. Controlling the provision of power to the circuits in this manner may reduce power consumption in comparison to continually providing power to the circuits regardless of operation.

The power supply terminals 126 are supplied with power supply potentials VDDQ and VSSQ. These power supply potentials VDDQ and VSSQ are supplied to an output buffer (not shown) included in the input/output circuit 117. The power supply potentials VDDQ and VSSQ may be the same potentials as the power supply potentials VDD2 and VSS that are supplied to the power supply terminals 125, respectively. However, the dedicated power supply potentials VDDQ and VSSQ may be used for the output buffer in the input/output circuit 117 so that power supply noise generated by the input/output circuit 17 does not propagate to the other circuit blocks.

Figure 2:
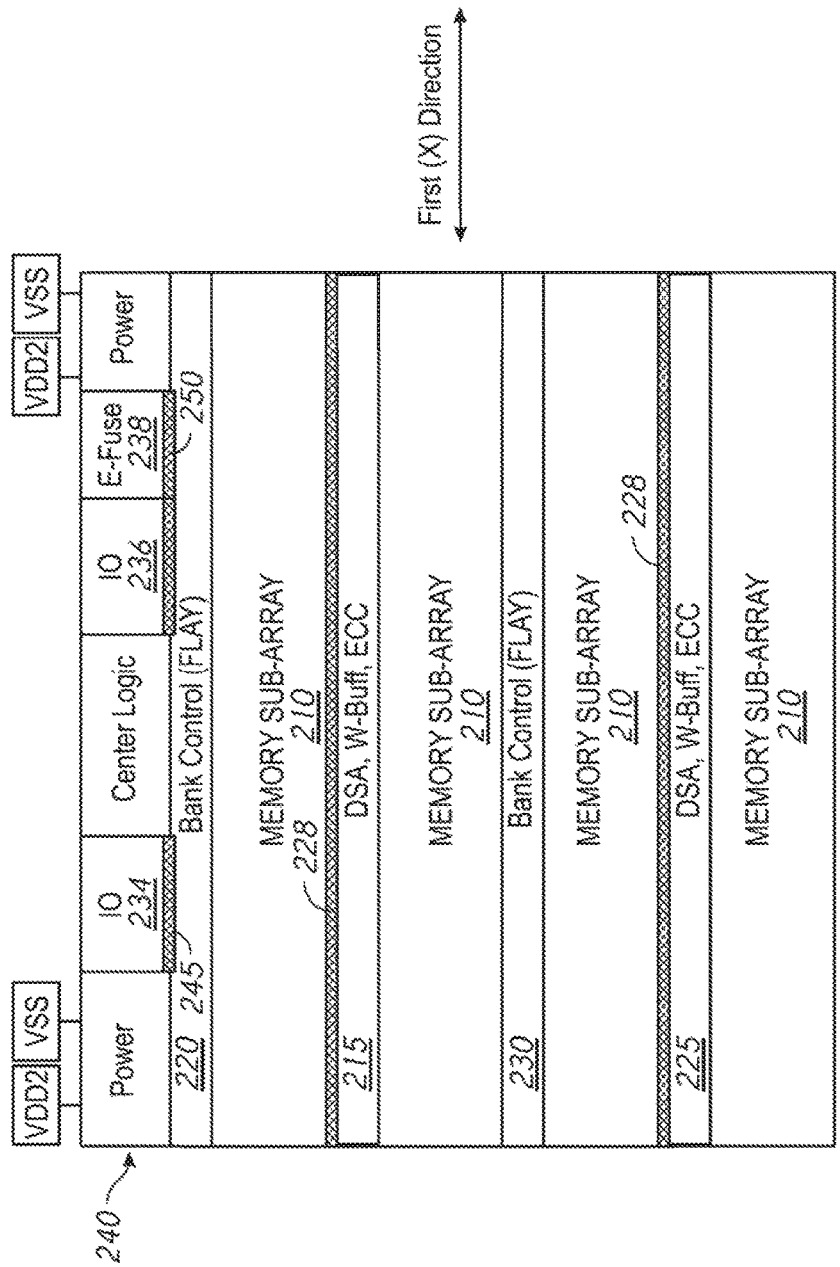
FIG. 2 is a block diagram of a memory array, memory array circuits, and peripheral circuits according to an embodiment of the disclosure.

FIG. 2 is a block diagram of a memory array, memory array circuits, and peripheral circuits according to an embodiment of the disclosure. In some embodiments, the memory array, memory array circuits, and peripheral circuits may be included in the semiconductor device 100 of FIG. 1. For example, the memory array and memory array circuits may be included in the memory cell array 111. The peripheral circuits may be included, in part or in whole, in various blocks of the semiconductor device 100, for example, in the command decoder 134, internal power supply circuit 139, input/output circuit 117, fuse circuit 114, voltage controller 140, and/or power gate circuits 142.

The memory array includes memory sub-arrays 210. The memory sub-arrays 210 are separated by regions 215, 220, 225, and 230. The regions 215, 225, and 230 are disposed between two memory sub-arrays 210. The regions 220 and 230 include bank control circuits. The bank control circuits may be used to control operation of the sub-arrays 210. For example, the bank control circuits may activate circuits for decoding memory addresses, preparing the sub-arrays for a memory access operation, and returning the sub-arrays to a deactivated state following memory access operations to the memory sub-arrays.

The regions 215 and 225 include memory array circuits. The memory array circuits include circuits that may be used during memory access operations to the memory sub-arrays 210. An example of memory array circuits is data sense amplifiers (DSAs). The DSAs may be used to amplify voltages corresponding to data read from the memory sub-arrays during a memory access operation. The amplified voltages may be provided to peripheral circuits. Another example of memory array circuits is write buffer (W-buff) circuits. The W-buff circuits may be used to drive voltages provided from peripheral circuits that correspond to data to be written to the memory sub-arrays 210. Another example of memory array circuits is error correction code (ECC) circuits. The ECC circuits may be used to detect and correct data errors in data read from or written to the memory sub-arrays 210. The memory array circuits may be conventional circuits known to those of ordinary skill in the art.

Further included in the regions 215 and 220 are power gate circuits 228 and conductive structures that may be used to provide power to the memory array circuits. The power gate circuits 228 may be used to control provision of power to the memory array circuits. For example, the power gate circuits 228 may be activated to provide power to the memory array circuits during operation. When the memory array circuits are not operating, for example, during a standby mode or a power savings mode, the power gate circuits 228 may be deactivated to prevent power from being provided to the memory array circuits. Controlling the provision of power to the memory array circuits in this manner may reduce power consumption in comparison to continually providing power to the memory array circuits regardless of operation. As will be described in greater detail below, the conductive structures and the power gate circuits 228 may be arranged vertically and extend along the length of the regions 215 and 220.

Peripheral circuits are included in a region 240 disposed at a periphery of the memory array. The peripheral circuits include circuits that may be used for receiving and providing data (e.g., IO circuits 234), decoding commands and providing internal control signals to perform operations (e.g., Center Logic circuits), for generating power that is provided to various circuits when the semiconductor device is powered up (e.g., Power circuits), among many other circuits. The peripheral circuits, may also include circuits for programming and storing information in non-volatile memory (e.g., E-Fuse circuits 238), such as information related to device configuration, memory repair, as well as other information. Some of the peripheral circuits may be coupled to bonding pads. For example, the Power circuits are shown to be coupled to power supply bonding pads (e.g., VDD2 and VSS), which may be used to provide external power to the Power circuits. While only the Power circuits are shown in FIG. 2 as being coupled to bonding pads, it will be appreciated that other circuits of the peripheral circuits may also be coupled to respective bonding pads (not shown).

Some of the peripheral circuits may be provided power through power gate circuits. For example, as shown in FIG. 2, the IO circuits 234 may be provided power through power gate circuits 245. In another example, the E-Fuse circuits 238 and the IO circuits 236 may be provided power through power gate circuits 250. The power gate circuits 245 and 250 may be formed in the periphery adjacent the circuits to which power is provided, along with conductive structures that may be used to provide power to the peripheral circuits. As will be described in greater detail below, the conductive structures and the power gate circuits 245 and 250 may be arranged vertically and extend lengthwise adjacent to the peripheral circuits that receive power through the power gate circuits 245 and 250.

The power gate circuits 245 and 250 may be used to control the provision of power to these peripheral circuits. For example, the power gate circuits 245 and 250 may be activated to provide power to the IO circuits 234 and 236 and the E-Fuse circuits 238 during operation. When these peripheral circuits are not operating, for example, during a standby mode or a power savings mode, the power gate circuits 245 and 250 may be deactivated to prevent power from being provided to the peripheral circuits. Controlling the provision of power to the peripheral circuits in this manner may reduce power consumption in comparison to continually providing power to the peripheral circuits regardless of operation.

Figure 3:
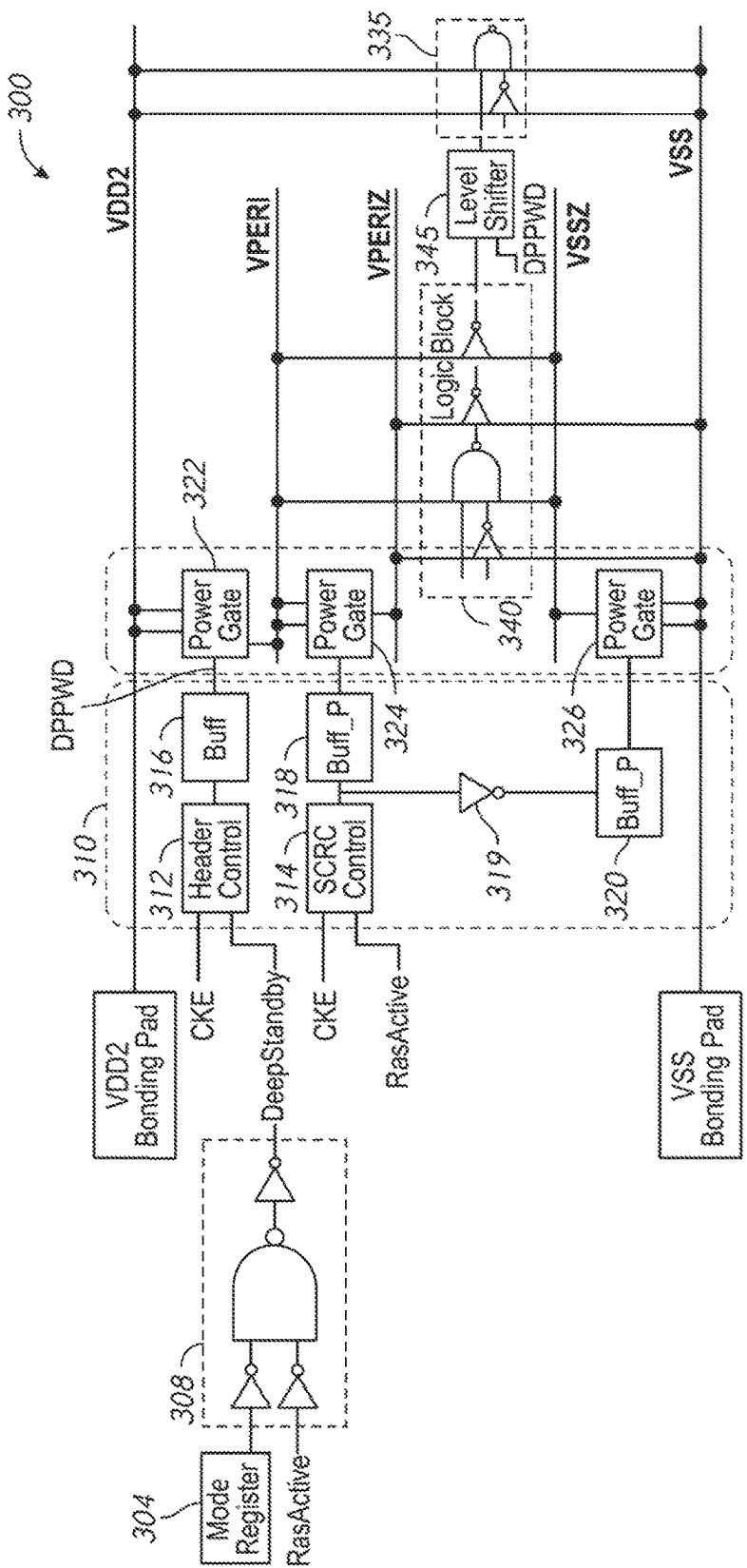
FIG. 3 is a schematic diagram of a hierarchical power gate structure according to an embodiment of the disclosure.

FIG. 3 is a schematic diagram of a hierarchical power gate structure 300 according to an embodiment of the disclosure. A voltage controller 310 receives control signals CKE, DeepStandby, and RasActive, and provides control signals to power gate circuits 322, 324, and 326. The DeepStandby control signal is provided by control logic 308 that receives the RasActive signal and information from a mode register 304. The RasActive signal is active (e.g., high logic level) to indicate that the circuits should be active for operation. The DeepStandby signal is active when a standby mode is enabled, as indicated by information programmed in the mode register 304 corresponding to the DeepStandby mode. The CKE signal is active when clocking circuits (not shown in FIG. 3) are activated for operation.

The voltage controller 310 includes control circuits 312 and 314, and buffer circuits 316, 318, and 320. The control circuit 312 receives the CKE and DeepStandby control signals and provides control signal DPPWD to the power gate circuit 322 through the buffer circuit 316. Based on the CKE and DeepStandby control signals, the power gate circuit 322 may be activated to provide the VDD2 supply voltage as the VPERI voltage, or deactivated to cease providing the VDD2 supply voltage as the VPERI voltage. The terms supply voltage and power voltage may be used interchangeably herein. The VDD2 supply voltage is provided to the power gate circuit 322 from a bonding pad to which the VDD2 voltage may be applied by an external source. In some embodiments of the disclosure, the power gate circuit 322 includes vertical p-channel transistors. The vertical p-channel transistors have conductive channel regions that are vertically oriented (e.g., perpendicular to a planar surface of a semiconductor die). In other embodiments of the disclosure, additional or alternative circuits may be included in the power gate circuit 322. In some embodiments of the disclosure, a high logic level DPPWD signal has a voltage greater than the VDD2 supply voltage, which may reduce subthreshold leakage current through the power gate circuit 322.

The control circuit 314 receives the CKE and RasActive control signals and provides control signals for the power gate circuit 324 through the buffer circuit 318. The control circuit 314 further provides control signals for the power gate circuit 326 through an inverter circuit 319. Based on the CKE and RasActive control signals, the power gate circuit 324 may be activated to provide the VPERI voltage as the VPERIZ voltage, or deactivated to cease providing the VPERI voltage as the VPERIZ voltage. In some embodiments of the disclosure, the power gate circuit 324 includes vertical p-channel transistors. In other embodiments of the disclosure, additional or alternative circuits may be included in the power gate circuit 324. Also based on the CKE and RasActive control signals, the power gate circuit 326 may be activated to provide the VSS supply voltage as the VSSZ voltage, or deactivated to cease providing the VSS supply voltage as the VSSZ voltage. The VSS supply voltage is provided to the power gate circuit 326 from a bonding pad to which the VSS voltage may be applied by an external source. In some embodiments of the disclosure, the power gate circuit 326 includes vertical n-channel transistors. In other embodiments of the disclosure, additional or alternative circuits may be included in the power gate circuit 326.

The power gate structure 300 of FIG. 3 may be used to control provision of power to various circuits. For example, the power gate circuit circuits 322, 344, and 326 may be controlled to provide power to logic circuits of the semiconductor device. As shown in FIG. 3, some circuits may receive power from the VDD2 and VSS supply voltages without being controlled through any power gate circuits. A logic block 335 includes logic circuits that receive power directly from the VDD2 and VSS supply voltages. In contrast, a logic block 340 includes various logic circuits coupled to power lines that provide the VPERI voltage and the VSSZ voltage. When the power gate circuits 322, 324, and 326 are activated, power is provided to the logic circuits of the logic block 340. However, when the power gate circuits 322, 324, and 326 are deactivated, no power is provided to the logic circuits of the logic block 340. A level shifter circuit 345 may receive signals from the logic circuits of the logic block 340 and provide output signals having voltages that are different than the voltages of the input signals.

While the power gate structure 300 is shown in FIG. 3 as having power gate circuits 322, 324, and 326, other embodiments of the disclosure may include greater or fewer power gate circuits. For example, a power gate structure according to an embodiment of the disclosure may include one power gate circuit, such as one of the power gate circuits 322, 324, and 326. Other embodiments of the disclosure may have two power gate circuits. The present disclosure is not limited to the specific number of power gate circuits shown in FIG. 3.

Operation of the power gate structure 300 of FIG. 3 will be described according to an embodiment of the disclosure with reference to FIG. 4. FIG. 4 is a diagram showing control of the power circuits 322, 324, and 326 according to information from the mode register 304, and the CKE, RasActive, and DeepStandby control signals. For example, the power gate circuits 322, 324, and 326 are active when the mode register 304 is programmed with a low logic level to disable the DeepStandby mode, but the CKE and RasActive signals are both active. Thus, the activated power gate circuits provide power, for example, to the logic circuits of the logic block 340. However, if the RasActive signal becomes inactive (although the CKE signal remains active and the power gate circuit 322 remains active), the power gate circuits 324 and 326 are deactivated to cut of power, for example, to the logic circuits of the logic block 340. FIG. 4 shows operation for other combinations of information from the mode register 304, and the CKE, RasActive, and DeepStandby control signals. The specific example of FIG. 4 is provided for illustrative purposes, and is not intended to limit the scope of the disclosure to the details of the specific example.

Figure 5:
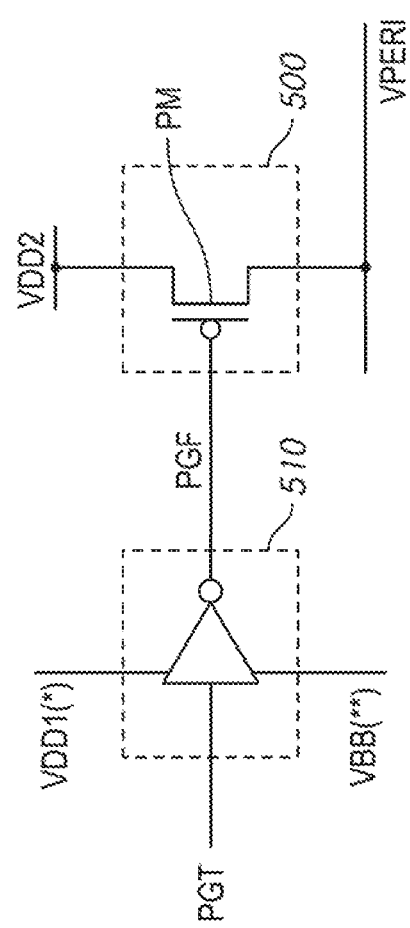
FIG. 5 is a schematic diagram of a power gate circuit according to an embodiment of the disclosure.

FIG. 5 is a schematic diagram of a power gate circuit 500 according to an embodiment of the disclosure. The power gate circuit 500 is configured to receive a buffered control signal PGF from a buffer circuit 510. The power gate circuit 500 provides a supply voltage (e.g., VDD2) as a VPERI voltage when activated. The power gate circuit 500 is activated by an active PGF signal (e.g., active low logic level). In some embodiments of the disclosure, the power gate circuit 500 includes a plurality of p-channel field effect transistors (pFET). The power gate circuit 500 may include other and/or additional circuits in some embodiments of the disclosure. As will be described in greater detail below, the pFETs of the power gate circuit 500 may include pFETs that are vertically coupled between a wiring that provides the supply voltage and a wiring to which the supply voltage is provided by the power gate circuit 500. In some embodiments of the disclosure, the vertically coupled transistors are vertical pFETs. The vertical transistors have conductive channel regions that are vertically oriented (e.g., perpendicular to a planar surface of a semiconductor die). In some embodiments, the pFETs of the power gate circuit 500 may also include planar pFETs. The planar pFETs have conductive channel regions that are horizontally oriented (e.g., parallel to a planar surface of a semiconductor die).

The buffer circuit 510 provides the PGF signal responsive to a control signal PGT. The buffer circuit 510 may include an inverter circuit. In such embodiments of the disclosure, the PGF signal has a logic level that is complementary to the logic level of the PGT signal. For example, in response to an active PGT signal (e.g., active high logic level), the PGT signal has a low logic level. Conversely, in response to an inactive PGT signal, the PGT signal has a high logic level. The voltage of the PGT signal may be either a first supply voltage (e.g., VDD1) or a second supply voltage (e.g., VBB). In some embodiments, the first supply voltage may be a positive voltage, and the second supply voltage may be a negative voltage. The first supply voltage represents a high logic level and the second supply voltage represents a low logic level. The magnitudes of the VDD1 voltage and the VBB voltage may be sufficient to activate the power gate circuit 500 to maximize current through the power gate circuit 500, and to deactivate the power gate circuit 500 to prevent any current through the power gate circuit 500.

In operation, an active PGT signal causes the power gate circuit 500 to be activated. As previously described, when the power gate circuit 500 is activated, the VDD2 voltage is provided as the VPERI voltage. The VPERI voltage may be provided to various circuits of a semiconductor device for operation. An inactive PGT signal causes the power gate circuit 500 to be deactivated so that the VDD2 voltage is no longer provided as the VPERI voltage. Deactivating the power gate circuit to cease providing the VDD2 voltage as the VPERI voltage may helpful in managing power consumption.

Figure 6:
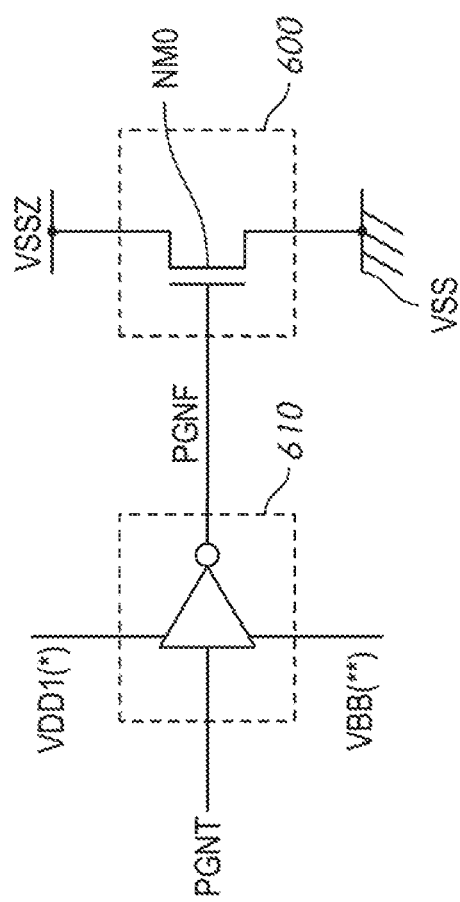
FIG. 6 is a schematic diagram of a power gate circuit according to an embodiment of the disclosure.

FIG. 6 is a schematic diagram of a power gate circuit 600 according to an embodiment of the disclosure. The power gate circuit 600 is configured to receive buffered control signal PGNF from a buffer circuit 610. The power gate circuit 600 provides a supply voltage (e.g., VSS) as a VSSZ voltage when activated. The power gate circuit 600 is activated by an active PGNF signal (e.g., active high logic level). In some embodiments of the disclosure, the power gate circuit 600 includes a plurality of n-channel field effect transistors (nFET). The power gate circuit 600 may include other and/or additional circuits in some embodiments of the disclosure. As will be described in greater detail below, the nFETs of the power gate circuit 600 may include nFETs that are vertically coupled between a wiring that provides the supply voltage and a wiring to which the supply voltage is provided by the power gate circuit 600. In some embodiments of the disclosure, the vertically coupled transistors are vertical nFETs. The vertical transistors have conductive channel regions that are vertically oriented (e.g., perpendicular to a planar surface of a semiconductor die). In some embodiments, the nFETs of the power gate circuit 600 may also include planar nFETs. The planar nFETs have conductive channel regions that are horizontally oriented (e.g. parallel to a planar surface of a semiconductor die).

The buffer circuit 610 provides the PGNF signal responsive to a control signal PGNT. The buffer circuit 610 may include an inverter circuit. In such embodiments of the disclosure, the PGNF signal has a logic level that is complementary to the logic level of the PGNT signal. For example, in response to an active PGNT signal (e.g., active low logic level), the PGNF signal has a high logic level. Conversely, in response to an inactive PGNT signal, the PGNF signal has a low logic level. The voltage of the PGNF signal may be either a first supply voltage (e.g., VDD1) or a second supply voltage (e.g., VBB). In some embodiments, the first supply voltage may be a positive voltage, and the second supply voltage may be a negative voltage. The first supply voltage represents a high logic level and the second supply voltage represents a low logic level. The magnitudes of the VDD1 voltage and the VBB voltage may be sufficient to activate the power gate circuit 600 to maximize current through the power gate circuit 600, and to deactivate the power gate circuit 600 to prevent any current through the power gate circuit 600.

In operation, an active PGNT signal (e.g., low logic level) causes the power gate circuit 600 to be activated. As previously described, when the power gate circuit 600 is activated, the VSS voltage is provided as the VSSZ voltage. The VSSZ voltage may be provided to various circuits of a semiconductor device for operation. An inactive PGNT signal (e.g., high logic level) causes the power gate circuit 600 to be deactivated so that the VSS voltage is no longer provided as the VSSZ voltage. Deactivating the power gate circuit 600 to cease providing the VSS voltage as the VSSZ voltage may helpful in managing power consumption.

In some embodiments of the disclosure, the power gate circuits 500 and 600 of FIGS. 5 and 6 may be used for one or more of the power gate circuits 322, 324, and 326 of FIG. 3.

Figure 7:
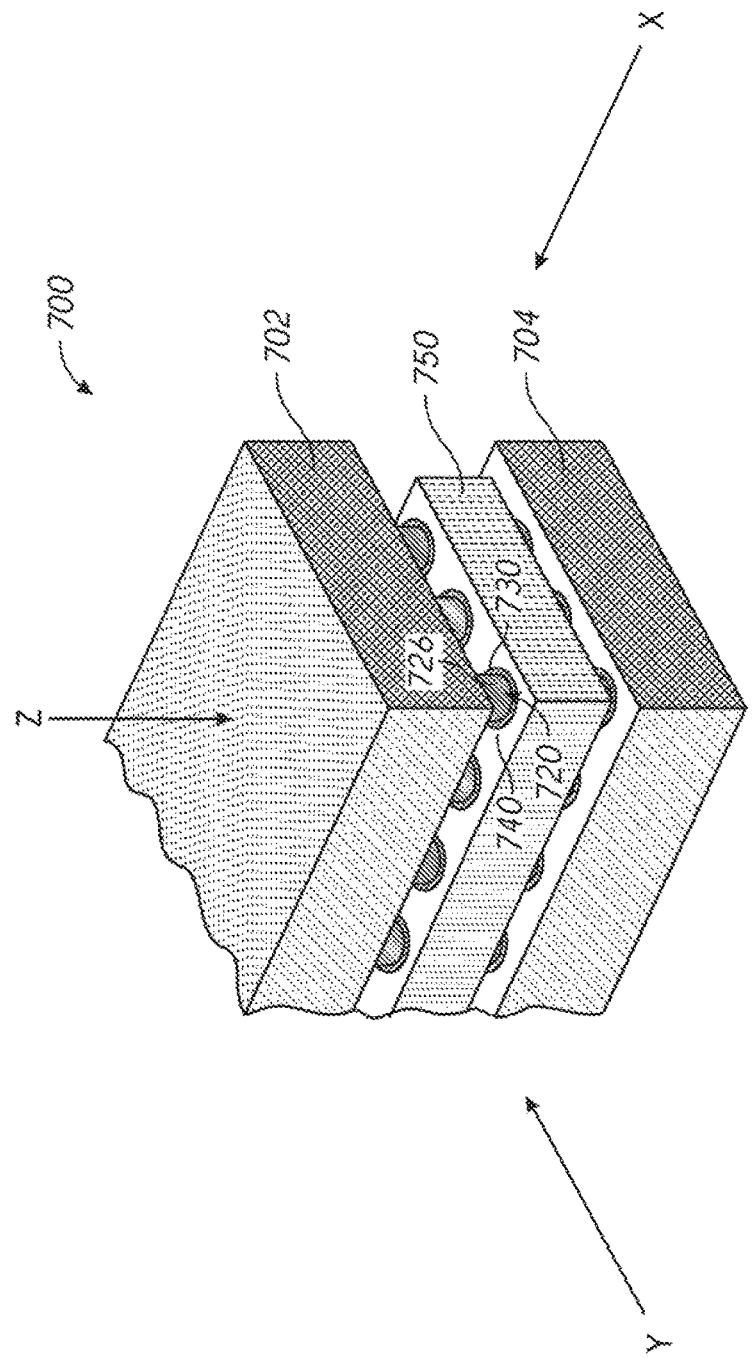
FIGS. 7 and 8A-8C are diagrams of a structure for a power gate circuit according to an embodiment of the disclosure.

FIGS. 7 and 8A-8C are diagrams of a structure 700 for a power gate circuit according to an embodiment of the disclosure. FIG. 8A is a diagram of a plan view of the structure 700 when viewed along the z-axis. FIG. 8B is a cross-sectional diagram of a cross-section of the structure 700 when viewed along the x-axis and FIG. 8C is a cross-sectional diagram of a cross-section of the structure 700 when viewed along the y-axis. Orientation of the x-axis and y-axis (as well as the z-axis) is shown in FIG. 7. The structure 700 may be fabricated using conventional semiconductor fabrication techniques known by those of ordinary skill in the art.

The structure 700 includes a plurality of transistors that are vertically coupled between a conductive structure 702 and a conductive structure 704. In the embodiment of FIGS. 7 and 8A 8C, the transistors are vertical transistors 710. The vertical transistors 710 are disposed between the conductive structure 702 and the conductive structure 704. The conductive structure 702 may be a voltage bus for providing a supply voltage (e.g., VDD2, VSS etc.) and the conductive structure 704 may be another voltage bus to which the supply voltage is provided by the vertical transistors 710. In some embodiments of the disclosure, the conductive structure 704 may be the voltage bus for providing a supply voltage (e.g., VDD2, VSS, etc.) and the conductive structure 702 may be the voltage bus to which the supply voltage is provided by the vertical transistors 710. The conductive structures 702 and 704 may be considered as wirings on which voltages (e.g., supply voltages, the voltage from the supply voltage) are provided. When activated, the vertical transistors 710 provide the supply voltage from the conductive structure 702 to the voltage bus of the conductive structure 704 or vice versa, for example, as a VPERI voltage, a VSSZ voltage, etc.

The vertical transistors 710 of the structure 700 may reduce the area of the power gate circuit in comparison to circuits having planar transistors. Moreover, the vertical transistors may have gates that are included in a gate electrode that is formed from a semiconductor material arranged as a layer in a same region as the conductive structures 702 and 704.

Each vertical transistor 710 includes a body 720, a gate 740, and a gate oxide 730. The body 720 may be a post of semiconductor material that extends between the conductive structures 702 and 704. The body 720 is shown in FIGS. 7 and 8A-8C as having a circular cross-section (with a circular perimeter). In other embodiments of the disclosure, however, the cross-section of the body 720 may have other shapes, for example, a polygonal cross-section. The body 720 includes a channel region 724, a conductive region 726 at an end of the body 720 proximate the conductive structure 702, and a conductive region 728 at an end of the body proximate the conductive structure 704. The conductive region 726 may be in contact with the conductive structure 702 and represent a source/drain region of the vertical transistor 710. The conductive region 728 may be in contact with the conductive structure 704 and represent another source/drain region of the vertical transistor 710. The gate oxide 730 is disposed circumferentially around the perimeter of the body 720. The gate oxide 730 may be a dielectric material formed on the surface of the body. The gate 740 is disposed around the gate oxide 730. The gate oxide 730 and the gate 740 generally define the extent of the channel region 724 of the body 720. The gate 740 is included in a gate electrode 750, which includes the gates 740 of the vertical transistors 710 of the structure 700. The gate electrode 750, and the conductive structure 702 and 704 are arranged vertically, and the gate electrode 750 is disposed between the conductive structures 702 and 704. The gate electrode 750 includes apertures which are penetrated by bodies of the transistors of the structure 700. The gate electrode 750 represents a wiring that is coupled to the gates 740 of the transistors of the structure 700. The gate electrode 750 may receive a control signal that controls activation of the power gate circuit of the structure 700. Examples of control signals were previously described, for example, with reference to FIG. 3, and the control signals provided by the control circuits 312 and 314.

The body 720 may be doped with various dopants. For example, in some embodiments of the disclosure the conductive regions 726 and 728 may be doped with p-type dopants, and the channel region 724 may be doped with n-type dopants to provide a vertical p-channel transistor. The structure 700 may include vertical transistors doped with dopants to provide vertical pFETs between the conductive structure 702 (e.g., that provides the VDD2 voltage) and the conductive structure 704 (e.g., which may be used to provide the VPERI voltage). Such a structure including vertical pFETs may be used for the power gate circuit 500 (FIG. 5). In other embodiments of the disclosure, the conductive regions 726 and 728 may be doped with n-type dopants, and the channel region 724 may be doped with p-type dopants to provide a vertical n-channel transistor. The structure 700 may include vertical transistors doped with dopants to provide vertical nFETs between the conductive structure 702 (e.g., that provides the VSS voltage) and the conductive structure 704 (e.g., which may be used to provide the VSSZ voltage). Such a structure including vertical nFETs may be used for the power gate circuit 600 (FIG. 6). The gate 740 (and more generally, the gate electrode 750) may be also doped with dopants.

The structure 700 for the power gate circuit is shown to include 12 vertical transistors 710. However, in other embodiments of the disclosure, greater or fewer vertical transistors 710 may be included. Thus, the scope of the disclosure is not limited to embodiments having a particular number of vertical transistors included.

Figure 9:
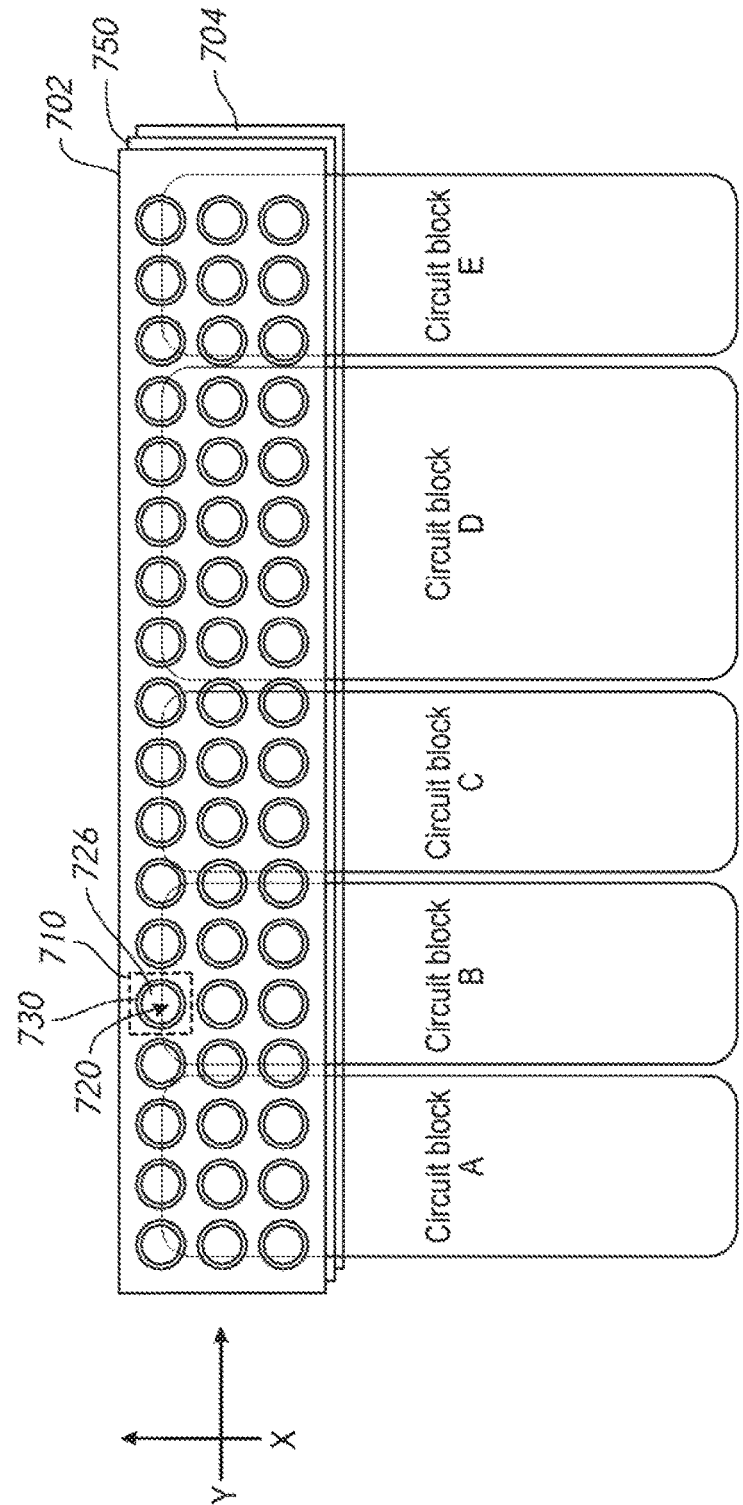
FIG. 9 is a diagram of a structure for a power gate circuit according to an embodiment of the disclosure.

FIG. 9 is a diagram of a structure 900 for a power gate circuit according to an embodiment of the disclosure. FIG. 9 shows a plan view of the structure 900 when viewed along the z-axis. The structure 900 includes structure 700, but extends lengthwise and includes more vertical transistors than shown in FIG. 7 for the structure 700. The structure 900 will be described with reference to the reference numbers used in FIG. 7.

The structure 900 includes a conductive structure 702 and a conductive structure 704. As previously described, the conductive structure 702 may be a voltage bus for providing a supply voltage (e.g., VDD2, VSS, etc.) and the conductive structure 704 may be another voltage bus to which the supply voltage is provided by the plurality of vertical transistors 710. In some embodiments of the disclosure, the conductive structure 704 may be the voltage bus for providing a supply voltage (e.g., VDD2, VSS, etc.) and the conductive structure 702 may be the voltage bus to which the supply voltage is provided by the plurality of vertical transistors 710. The conductive structures 702 and 704 may be considered as wirings on which voltages (e.g., supply voltages, the voltage from the supply voltage) are provided. When activated, the plurality of vertical transistors 710 provide the supply voltage from the conductive structure 702 to the voltage bus of the conductive structure 704 or vice versa, for example, as a VPERI voltage, a VSSZ voltage, etc.

As previously described with reference to FIG. 7, a plurality of vertical transistors 710 are disposed between the conductive structure 702 and the conductive structure 704. A gate electrode 750 is disposed between the conductive structures 702 and 704, and includes gates of the plurality of vertical transistors 710. The conductive structures 702 and 704, and the gate electrode 750 are arranged vertically and extend lengthwise. The vertical arrangement of the conductive structures 702 and 704, and the gate electrode 750 may reduce the area used by power gate circuits in comparison to circuits having planar transistors.

FIG. 9 further shows a plurality of circuit block regions A-E. The circuit blocks include circuits that may receive power from the conductive structure 704. For example, with reference to FIG. 2, in some embodiments of the disclosure the structure 900 may be used for the power gate circuits 228, and the circuit block regions A-E represent the data sense amplifiers, write buffer circuits, error correction code circuits that receive power from the power gate circuits 228. The circuit block regions A-E extend in a planar direction from the structure 900. In some embodiments of the disclosure, for example, as shown in FIG. 9, the conductive structures 702 and 704, and, the gate electrode 750 overlap a portion of the circuit block regions A-E. In other embodiments of the disclosure, however, the conductive structures 702 and 704, and the gate electrode do not overlap the circuit block regions A-E. Each of the circuit block regions A-E may be coupled to the conductive structure 704 to receive power from the conductive structure 702 when the vertical transistors are activated.

Figure 8:
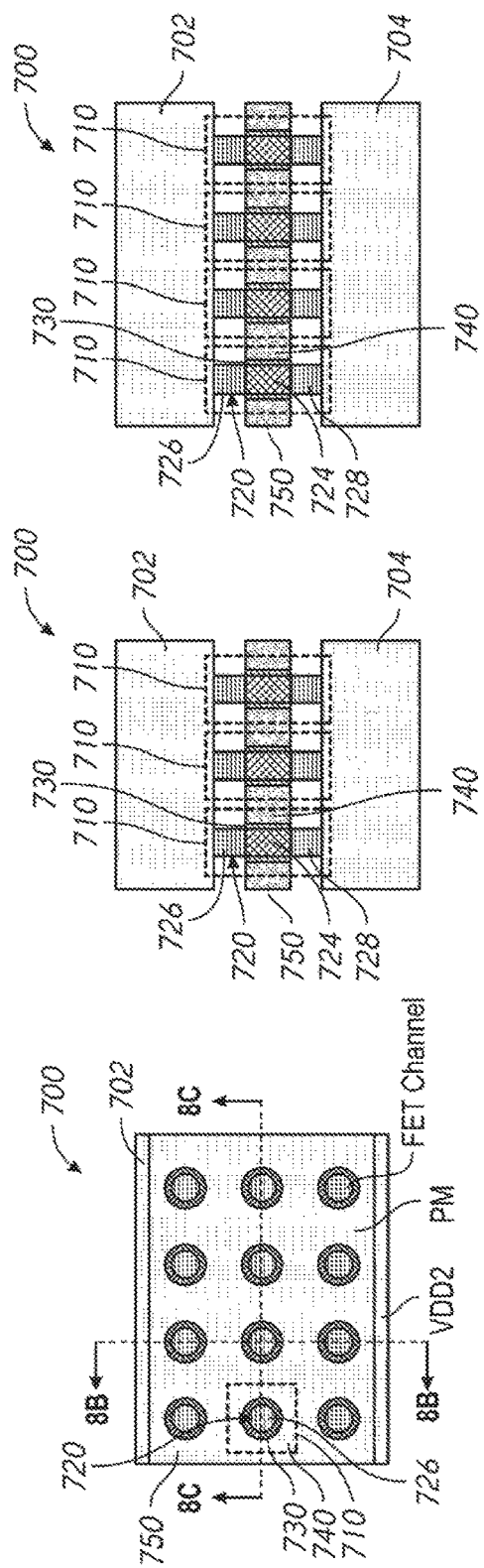

The structure 900 may be formed using different layers of the semiconductor device, which will be described in greater detail below with reference to FIG. 8. The structure 900, as previously described, may be used with the structure 700 of FIGS. 7 and 8A-8C in some embodiments of the disclosure. The structure 900 may also be used with, as later described, a structure 1300 of FIGS. 13 and 14A-14C in some embodiments of the disclosure.

Figure 10:
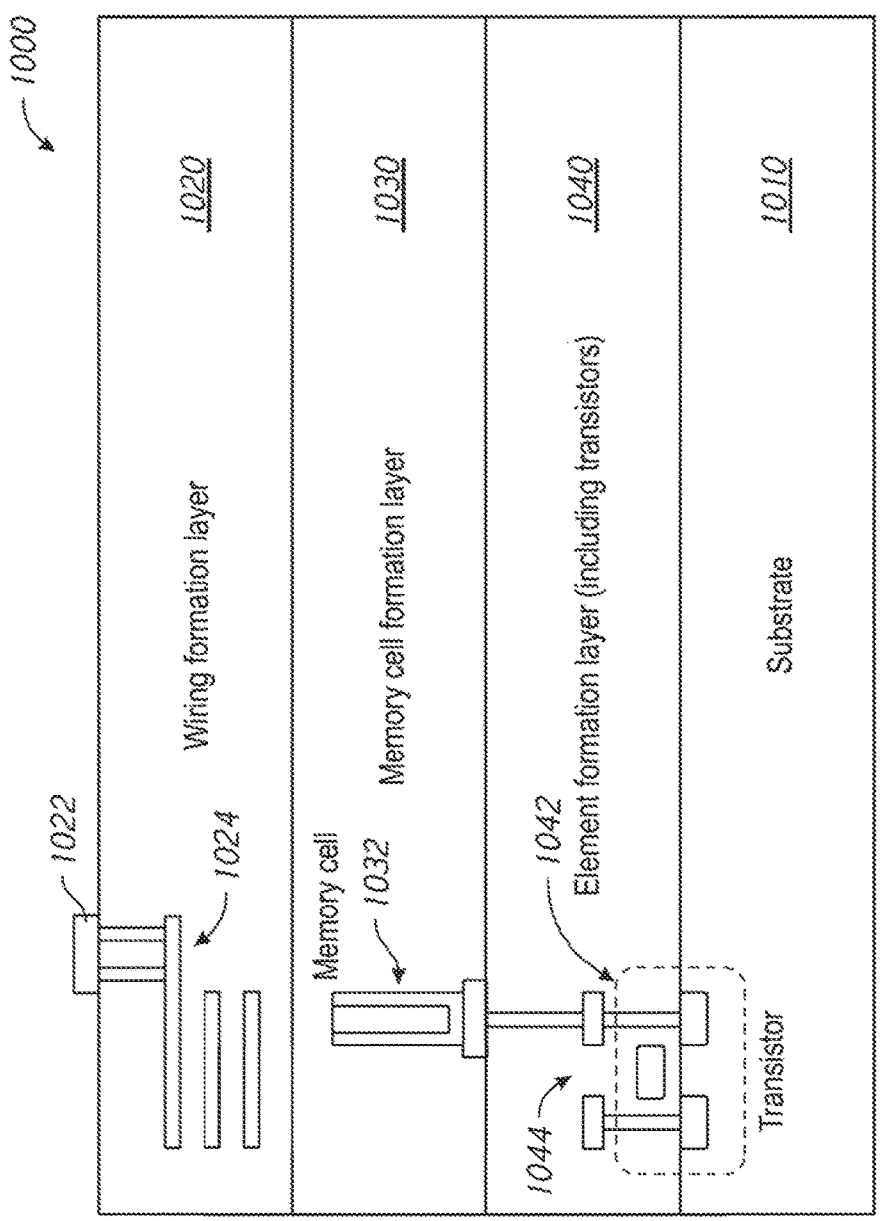
FIG. 10 is a cross-sectional diagram of a semiconductor device including a plurality of formation layers and a substrate according to an embodiment of the disclosure.

FIG. 10 is a cross-sectional diagram of a semiconductor device 1000 including a plurality (e.g., three) of formation layers and a substrate 1010 according to an embodiment of the disclosure. The semiconductor device 1000 includes a wiring formation layer 1020, a memory cell formation layer 1030, and an element formation layer 1040. The wiring formation layer 1020 includes a bonding pad 1022 thereon and multiple wirings 1024 formed in different levels. The memory cell formation layer 1030 includes a memory cell 1032 therein. While FIG. 10 shows a memory cell 1032 having a capacitor (e.g., a dynamic random access memory cell DRAM), the scope of the disclosure is not limited to memory cells including capacitors. In other embodiments of the disclosure, other types of memory cells 1032 may be included, for example, magnetic RAM, resistive RAM, ferroelectric RAM, etc. The memory cell formation layer 1030 may further include multiple wirings formed in different levels (e.g., wiring for an upper electrode of memory cell, wiring for a lower electrode of memory cell, etc.). The element formation layer 1040 includes transistors 1042 therein. The transistors 1042 are shown as planar transistors in FIG. 10. However, in some embodiments of the disclosure, vertical transistors may be additionally, or alternatively included. The element formation layer 1040 further includes multiple wirings 1044 farmed in different levels (e.g., wirings coupled to gate, source or drain).

Vertical transistors of power gate circuits according to embodiments of the disclosure, for example, the structure 700 of FIGS. 7 and 8A-8C, the structure 900 of FIG. 9, and as later described, a structure 1300 of FIGS. 13 and 14A-14C, may be formed in any one of the formation layers 1020, 1030, 1040 which are aver the substrate 1010. However, in some embodiments of the disclosure, the vertical transistors of power gate circuits are formed in the wiring formation layer 1020 because the resistance of wires formed in the wiring formation layer 1020 is typically the least of the formation layers.

For example, in an embodiment of the disclosure directed to the structure 900 of FIG. 9, the structure 900 may be formed using an upper wiring layer (e.g., the wiring formation layer), which will provide low parasitic resistance value of the voltage wirings. As known, the transistors of a power gate circuit are required to have very large current driving capability, so usually a very large layout area is required to provide the transistors of such power gate circuits. In embodiments of the disclosure where the vertical transistors are formed in the upper (or middle, e.g., memory cell formation layer) wiring layer, the voltage wiring region may be overlapped with circuit block regions. In other embodiments of the disclosure, the voltage wirings are shifted along the direction of the y-axis such that the voltage wiring region is not overlapped with the circuit block regions.

Figure 11:
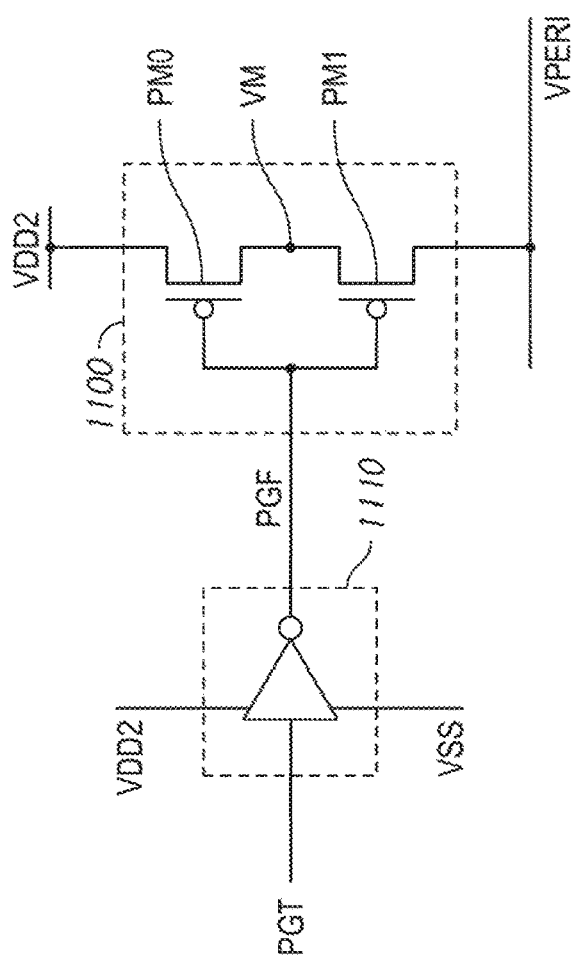
FIG. 11 is a schematic diagram of a power gate circuit according to an embodiment of the disclosure.

FIG. 11 is a schematic diagram of a power gate circuit 1100 according to an embodiment of the disclosure. The power gate circuit 1100 is configured to receive a buffered control signal PGF from a buffer circuit 1110. The power gate circuit 1100 provides a supply voltage (e.g., VDD2) as a VPERI voltage when activated. The power gate circuit 1100 is activated by an active PGF signal (e.g., active low logic level). In some embodiments of the disclosure, the power gate circuit 1100 includes a plurality of p-channel field effect transistors (pFET). For example, the plurality of pFETs of the power gate circuit 1100 may be structured as two series coupled pFETs. The power gate circuit 1100 may include other and/or additional circuits in other embodiments of the disclosure. As will be described in greater detail below, the pFETs of the power gate circuit 1100 may include pFETs that are vertically coupled between a wiring that provides the supply voltage and a wiring to which the supply voltage is provided by the power gate circuit 1100. In some embodiments of the disclosure, the vertically coupled transistors are vertical pFETs. The vertical transistors have conductive channel regions that are vertically oriented (e.g., perpendicular to a planar surface of a semiconductor die). In some embodiments, the pFETs of the power gate circuit 1100 may also include planar pFETs. The planar pFETs have conductive channel regions that are horizontally oriented (e.g., parallel to a planar surface of a semiconductor die).

The buffer circuit 1110 provides the PGF signal responsive to a control signal PGT. The buffer circuit 1110 may include an inverter circuit. In such embodiments of the disclosure, the PGF signal has a logic level that is complementary to the logic level of the PGT signal. For example, in response to an active PGT signal (e.g., active high logic level), the PGF signal has a low logic level. Conversely, in response to an inactive PGT signal, the PGF signal has a high logic level. The voltage of the PGF signal may be either a first supply voltage (e.g., VDD2) or a second supply voltage (e.g., VSS). In some embodiments, the first supply voltage may be a positive voltage, and the second supply voltage may be ground. The first supply voltage represents a high logic level and the second supply voltage represents a low logic level. The magnitudes of the VDD2 voltage and the VSS voltage may be sufficient to activate the power gate circuit 1100 to maximize current through the power gate circuit 1100, and to deactivate the power gate circuit 1100 to prevent any current through the power gate circuit 1100.

In operation, an active PGT signal causes the power gate circuit 1100 to be activated. As previously described, when the power gate circuit 1100 is activated, the VDD2 voltage is provided as the VPERI voltage. The VPERI voltage may be provided to various circuits of a semiconductor device for operation. An inactive POT signal causes the power gate circuit 1100 to be deactivated so that the VDD2 voltage is no longer provided as the VPERI voltage. Deactivating the power gate circuit to cease providing the VDD2 voltage as the VPERI voltage may helpful in managing power consumption.

Figure 12:
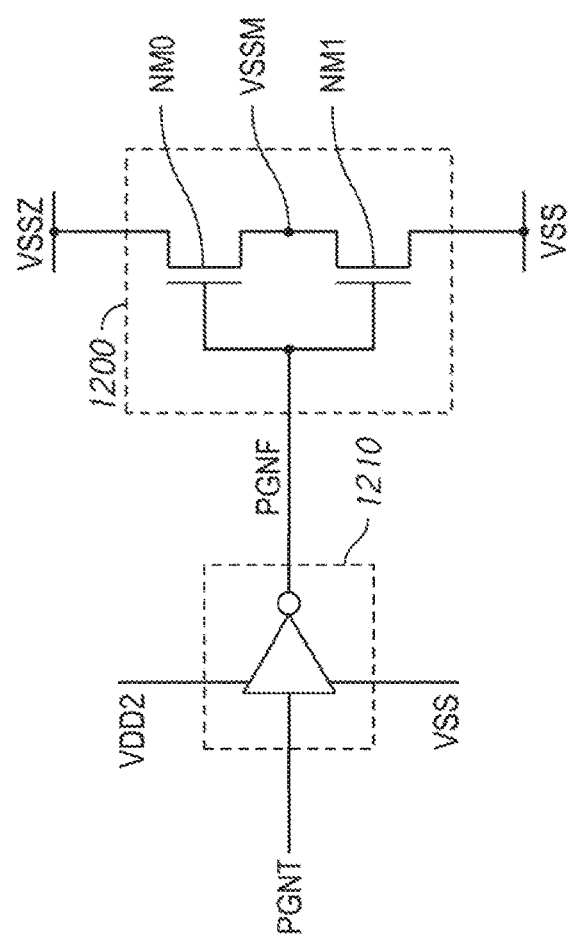
FIG. 12 is a schematic diagram of a power gate circuit according to an embodiment of the disclosure.

FIG. 12 is a schematic diagram of a power gate circuit 1200 according to an embodiment of the disclosure. The power gate circuit 1200 is configured to receive a buffered control signal PGNF from a buffer circuit 1210. The power gate circuit 1200 provides a supply voltage (e.g., VSS) as a VSSZ voltage when activated. The power gate circuit 1200 is activated by an active PGNT signal (e.g., active high logic level). In some embodiments of the disclosure, the power gate circuit 1200 includes a plurality of n-channel field effect transistors (nFET). For example, the plurality of nFETs of the power gate circuit 1200 may be structured as two series coupled nFETs. The power gate circuit 1200 may include other and/or additional circuits in other embodiments of the disclosure. As will be described in greater detail below, the nFETs of the power gate circuit 1200 include nFETs that are vertically coupled between a wiring that provides the supply voltage and a wiring to which the supply voltage is provided by the power gate circuit 1200. In some embodiments of the disclosure, the vertically coupled transistors are vertical nFETs. The vertical transistors have conductive channel regions that are vertically oriented (e.g., perpendicular to a planar surface of a semiconductor die). In some embodiments, the nFETs of the power gate circuit 1200 may also include planar nFETs. The planar nFETs have conductive channel regions that are horizontally oriented (e.g., parallel to a planar surface of a semiconductor die).

The buffer circuit 1210 provides the PGNF signal responsive to a control signal PGNT. The buffer circuit 1210 may include an inverter circuit. In such embodiments of the disclosure, the PGNF signal has a logic level that is complementary to the logic level of the PUNT signal. For example, in response to an active PGNT signal (e.g., active low logic level), the PGNF signal has a high logic level. Conversely, in response to an inactive PGNT signal, the PGNT signal has a low logic level. The voltage of the PGNF signal may be either a first supply voltage (e.g., VDD2) or a second supply voltage (e.g., VSS). In some embodiments, the first supply voltage may be a positive voltage, and the second supply voltage may be ground. The first supply voltage represents a high logic level and the second supply voltage represents a low logic level. The magnitudes of the VDD2 voltage and the VSS voltage may be sufficient to activate the power gate circuit 1200 to maximize current through the power gate circuit 1200, and to deactivate the power gate circuit 1200 to prevent any current through the power gate circuit 1200.

In operation, an active PGNT signal (e.g., low logic level) causes the power gate circuit 1200 to be activated. As previously described, when the power gate circuit 1200 is activated, the VSS voltage is provided as the VSSZ voltage.

The VSSZ voltage may be provided to various circuits of a semiconductor device for operation. An inactive PGNT signal (e.g., high logic level) causes the power gate circuit 1200 to be deactivated so that the VSS voltage is no longer provided as the VSSZ voltage. Deactivating the power gate circuit 1200 to cease providing the VSS voltage as the VSSZ voltage may helpful in managing power consumption.

In some embodiments of the disclosure, the power gate circuits 1100 and 1200 of FIGS. 11 and 12 may be used for one or more of the power gate circuits 322, 324, and 326 of FIG. 3.

Figure 13:
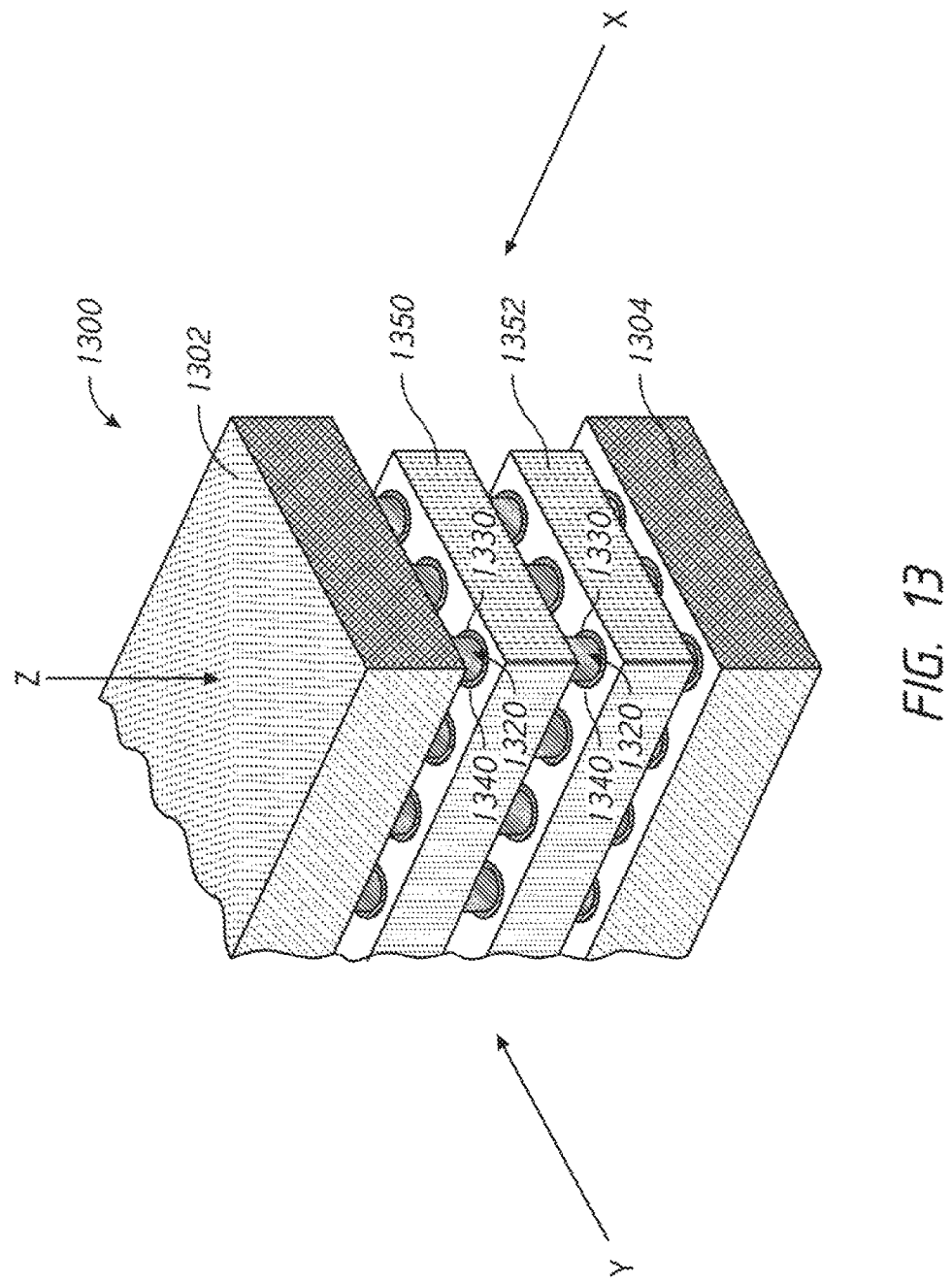
FIGS. 13 and 14A-14C are diagrams of a structure for a power gate circuit according to an embodiment of the disclosure.
Figures 14A, 14B, 14C:
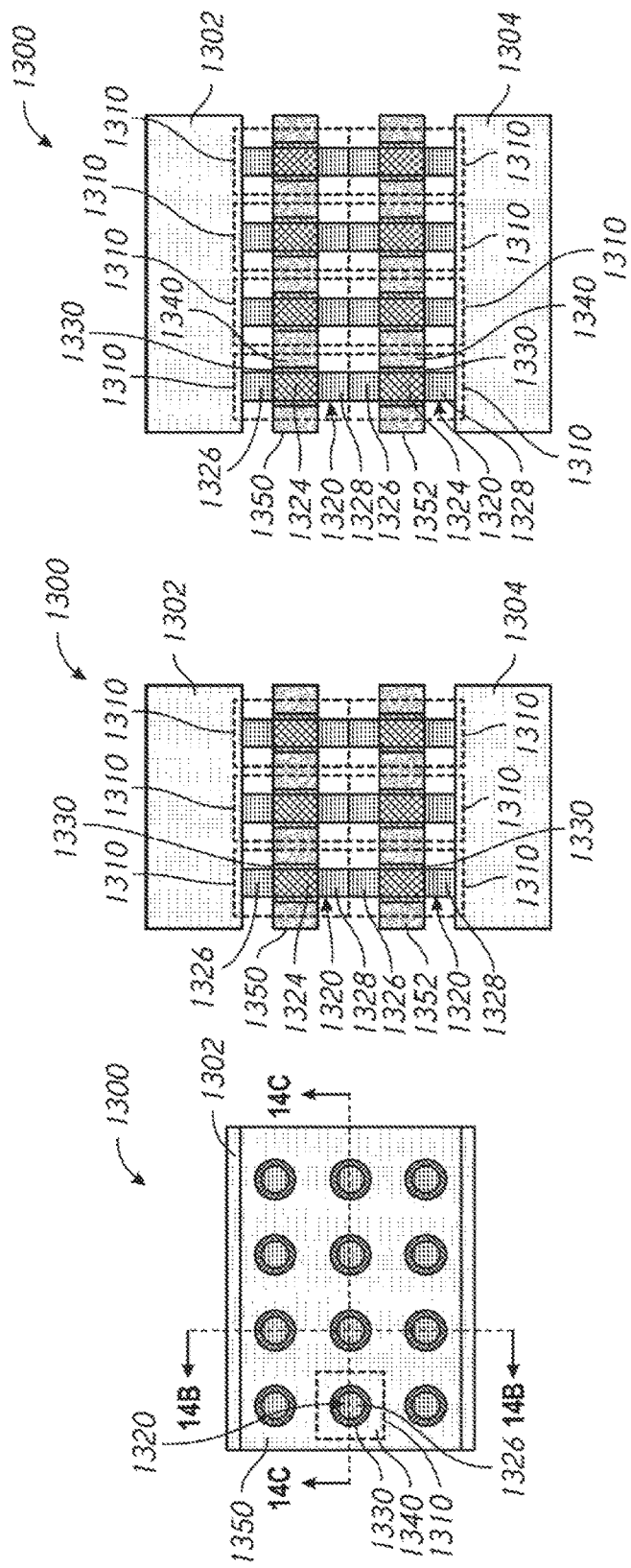

FIGS. 13 and 14A-14C are diagrams of a structure 1300 for a power gate circuit according to an embodiment of the disclosure. FIG. 14A is a diagram of a plan view of the structure 1300 when viewed along the z-axis. FIG. 14B is a cross-sectional diagram of a crass-section of the structure 1300 when viewed along the x-axis and FIG. 14C is a cross-sectional diagram of a cross-section of the structure 1300 when viewed along the y-axis. Orientation of the x-axis and y-axis (as well as the z-axis) is shown in FIG. 13. The structure 1300 may be fabricated using conventional semiconductor fabrication techniques known by those of ordinary skill in the art.

The structure 1300 includes a plurality of transistors that are vertically coupled between a conductive structure 1302 and a conductive structure 1304. In the embodiment of FIGS. 13 and 14A-14C, the transistors are vertical transistors 1310. The vertical transistors 1310 are disposed between a conductive structure 1302 and a conductive structure 1304. The plurality of vertical transistors are arranged in pairs of transistors 1310 which are stacked on one another between the conductive structure 1302 and the conductive structure 1304. The stacking of the vertical transistors 1310 provide two series coupled transistors between the conductive structures 1302 and 1304. The conductive structure 1302 may be a voltage bus for providing a supply voltage (e.g., VDD2, VSS, etc.) and the conductive structure 1304 may be another voltage bus to which the supply voltage is provided by the vertical transistors 1310. In some embodiments of the disclosure, the conductive structure 1304 may be the voltage bus for providing a supply voltage (e.g., VDD2, VSS, etc.) and the conductive structure 1302 may be the voltage bus to which the supply voltage is provided by the vertical transistors 1310. The conductive structures 1302 and 1304 may be considered as wirings on which voltages (e.g., supply voltages, the voltage from the supply voltage) are provided. When activated, the vertical transistors 1310 provide voltage from one conductive structure to the other conductive structure. For example, where the conductive structure 1302 provides a VDD2 voltage, the activated vertical transistors 1310 provide the VDD2 voltage to the conductive structure 1304, which is provided as the VPERI voltage. The structure 1300 tar the power gate circuit is shown to include 12 stacked pairs of vertical transistors 1310. However, in other embodiments of the disclosure, greater or fewer vertical transistors 1310 may be included. Thus, the scope of the disclosure is not limited to embodiments having a particular number of vertical transistors included.

The vertical transistors 1310 of the structure 1300 may reduce the area of the power gate circuit in comparison to circuits including planar transistors. Moreover, the vertical transistors 1310 may have gates that are included in gate electrodes 1350 and 1352 that are fanned from a semiconductor material arranged as respective layers in a same region as the conductive structures 1302 and 1304. Each vertical transistor 1310 includes a body 1320, a gate 1340, and a gate oxide 1330. The body 1320 may be a post of semiconductor material that extends between the conductive structures 1302 and 1304. The body 1320 is shown in FIGS. 13 and 14A-14C as having a circular cross-section (with a circular perimeter). In other embodiments of the disclosure, however, the cross-section of the body 1320 may have other shapes, for example, a polygonal cross-section. The stacked transistors include respective bodies that share a post of semiconductor material that extends between the conductive structures 1302 and 1304.

The body 1320 includes a channel region 1324, a conductive region 1326 at one side of the channel region 1324, and a conductive region 1328 at the other side of the channel region 1324. For a pair of stacked vertical transistors 1310, one of the conductive regions of each of the two vertical transistors are merged together in a region of the semiconductor post that is between the gate electrodes 1350 and 1352. The other conductive region of each of the two vertical transistors is in contact with one of the conductive structures 1302 and 1304. The conductive regions 1326 and 1328 represent a respective source/drain region of the vertical transistor.

The gate oxide is 1330 is disposed circumferentially around the perimeter of the body 1320. The gate oxide 1330 may be a dielectric material formed on the surface of the body. The gate 1340 is disposed around the gate oxide 1330. The gate oxide 1330 and the gate 1340 of the vertical transistors 1310 generally define the extent of the channel region 1324 of the body 1320. The gate 1340 is included in the gate electrode 1350 or the gate electrode 1352. The gate electrode 1350 includes the gates 1340 of one transistor of the pairs of vertical transistors (e.g., gates of the vertical transistors adjacent the conductive structure 1302). The gate electrode 1352 includes the gates 1340 of the other transistor of the pairs of vertical transistors (e.g., gates of the vertical transistors adjacent the conductive structure 1304). The gate electrodes 1350 and 1352, and the conductive structure 1302 and 1304 are arranged vertically, and the gate electrodes 1350 and 1352 are disposed between the conductive structures 702 and 704. The gate electrodes 1350 and 1352 include apertures which are penetrated by bodies of the transistors of the structure 1300. The gate electrode 1350 and 1352 each represent a separate wiring that is coupled to respective gates 1340 of the transistors of the structure 1300. The gate electrodes 1350 and 1352 may receive a control signal that controls activation of the power gate circuit of the structure 1300. Examples of control signals were previously described, for example, with reference to FIG. 3, and the control signals provided by the control circuits 312 and 314.

The body 1320 of the vertical transistors 1310 may be doped with various dopants. For example, in some embodiments of the disclosure the conductive regions 1326 and 1328 may be doped with p-type dopants, and the channel region 1324 may be doped with n-type dopants to provide a vertical p-channel transistor. The structure 1300 may include vertical transistors doped with dopants to provide vertical pFETs between the conductive structure 1302 (e.g., that provides the VDD2 voltage) and the conductive structure 1304 (e.g., which may be used to provide the VPERI voltage). Such a structure including vertical pFETs may be used for the power gate circuit 1100 (FIG. 11). In other embodiments of the disclosure, the conductive regions 1326 and 1328 may be doped with n-type dopants, and the channel region 1324 may be doped with p-type dopants to provide a vertical n-channel transistor. The structure 1300 may include vertical transistors doped with dopants to provide vertical nFETs between the conductive structure 1302 (e.g., that provides the VSS voltage) and the conductive structure 1304 (e.g., which may be used to provide the VSSZ voltage). Such a structure including vertical nFETs may be used for the power gate circuit 1200 (FIG. 12). The gate 1340 (and more generally, the gate electrodes 1350 and 1352) may be also doped with dopants.

In comparison to the structure 700 of FIGS. 7 and 8A-8C, the vertical transistors 1310 of structure 1300 of FIGS. 13 and 14A-14C may have thinner gate oxides relative to the gate oxides of the vertical transistors 710. Thinner gate oxides may be used for the vertical transistors 1310 because of the series coupled nature of two stacked vertical transistors between the conductive structures 1302 and 1304. A structure having stacked vertical transistors (e.g., series coupled) between conductive structures may reduce subthreshold current leakage in comparison to a structure having one vertical transistor between conductive structures due to the resulting gate-source voltage applied to the transistors. For example, the vertical transistor adjacent the conductive structure to which a supply voltage will be applied will have a gate-source voltage that may reduce subthreshold leakage currents from conducting through the vertical transistor.

From the foregoing it will be appreciated that, although specific embodiments of the disclosure have been described herein for purposes of illustration, various modifications may be made without deviating, from the spirit and scope of the disclosure. Accordingly, the scope disclosure should not be limited any of the specific embodiments described herein.

What is claimed is:

1. An apparatus, comprising:
   a substrate;
   a first wiring supplied with a power voltage, the first wiring being formed over the substrate and elongating in a first direction;
   a second wiring formed between the substrate and the first wiring with vertically overlapping the first wiring, the second wiring elongating in the first direction;
   a plurality of transistors vertically coupled between the first wiring and the second wiring;
   a third wiring formed between the first wiring and the second wiring, the third wiring elongating in the first direction and being coupled to each of gates of the plurality of vertical transistors; and
   an external terminal receiving a clock enable signal, wherein the third wiring is configured to receive a control signal of which logic level is controlled responsive to the clock enable signal.

2. The apparatus of claim 1, wherein the third wiring has a plurality of apertures each penetrated by a corresponding one of sets of gates and bodies of the plurality of transistors.

3. The apparatus of claim 1, further comprising a plurality of circuit blocks arranged in the first direction and under the second wiring, each of the plurality of circuit blocks being configured to be supplied with the power voltage from the second wiring.

4. An apparatus, comprising:
   a substrate;
   a first wiring supplied with a power voltage, the first wiring being formed over the substrate and elongating in a first direction;
   a second wiring formed between the substrate and the first wiring with vertically overlapping the first wiring, the second wiring elongating in the first direction:
   a plurality of transistors vertically coupled between the first wiring and the second wiring;
   a third wiring between the first wiring and the second wiring;

a fourth wiring between the third wiring and the second wiring; and a plurality of additional transistors each coupled between a corresponding one of the plurality of transistors and the second wiring;

wherein the third wiring elongates in the first direction and coupled to each of gates of the plurality of transistors and wherein the fourth wiring elongates in the first direction and coupled to each of gates of the plurality of additional transistors.

5. The apparatus of claim 4, further comprising an external terminal receiving a clock enable signal, wherein the third wiring is configured to receive a control signal of which logic level is controlled responsive to the clock enable signal.

6. The apparatus of claim 5, wherein the fourth wiring is configured to receive the control signal.

7. The apparatus of claim 5, further comprising a command decoder configured to output a row activate signal, wherein the fourth wiring is configured to receive an additional control signal of which logic level is controlled responsive to the row activate signal.

8. An apparatus, comprising:
a plurality of circuit blocks, each circuit block including circuits;
a first conductive structure configured to be provided a supply voltage;
a second conductive structure configured to provide power to the circuits of the plurality of circuit blocks;
a third conductive structure configured to be provided a second supply voltage;
a fourth conductive structure configured to provide power to the circuits of the plurality of circuit blocks;
a plurality of vertical transistors disposed between the first and second conductive structures and configured to provide power from the first conductive structure to the second conductive structure when activated, each of the plurality of vertical transistors including a respective gate included in a gate electrode disposed between the first and second conductive structures; and
a second plurality of vertical transistors disposed between the third and fourth conductive structures and configured to provide power from the third conductive structure to the fourth conductive structure when activated, each of the second plurality of vertical transistors including a respective gate included in a second gate electrode disposed between the third and fourth conductive structures.

9. The apparatus of claim 8 wherein each of the plurality of vertical transistors comprises a p-channel field effect transistor.

10. The apparatus of claim 8 wherein each of the plurality of vertical transistors comprises an n-channel field effect transistor.

11. The apparatus of claim 8 wherein each of the plurality of vertical transistors comprises a p-channel field effect transistor and wherein each of the second plurality of vertical transistors comprises an n-channel field effect transistor.

12. The apparatus of claim 8 wherein the first conductive structure, the second conductive structure, and the gate electrode extend lengthwise adjacent the circuits of the plurality of circuit blocks.

13. An apparatus, comprising:
a plurality of circuit blocks, each circuit block including circuits;
a first conductive structure configured to be provided a supply voltage;
a second conductive structure configured to provide power to the circuits of the plurality of circuit blocks; and
a plurality of pairs of vertical transistors disposed between the first and second conductive structures, each of the pairs of vertical transistors including stacked vertical transistors, the plurality of pairs of vertical transistors configured to provide power from the first conductive structure to the second conductive structure when activated, each of the plurality of pairs of vertical transistors including a first gate included in a first gate electrode disposed between the first and second conductive structures and further including a second gate included in a second gate electrode disposed between the first gate electrode and the second conductive structure.

14. The apparatus of claim 13 wherein the first conductive structure, the second conductive structure, the first gate electrode, and the second gate electrode are arranged vertically and adjacent the circuits of the plurality of circuit blocks.

15. The apparatus of claim 13 wherein the first and second gate electrodes are configured to receive a same signal to control activation of each of the plurality of pairs of vertical transistors.

16. The apparatus of claim 13 wherein the stacked vertical transistors of each of the pairs of vertical transistors share a post of semiconductor material that extends between the first and second conductive structures.

17. The apparatus of claim 13 wherein each the stacked vertical transistors of each of the pairs of vertical transistors includes a respective body having a circular cross-section.

* * * * *